United States Patent [19]

Rordorf

[11] 4,354,910

[45] Oct. 19, 1982

[54] METHOD AND APPARATUS FOR THE PARTIAL COATING OF A SUBSTRATE BY CATHODE SPUTTERING

[75] Inventor: Horst Rordorf, Weiningen, Switzerland

[73] Assignee: Berna AG Olten, Olten, Switzerland

[21] Appl. No.: 223,285

[22] Filed: Jan. 8, 1981

[30] Foreign Application Priority Data

Jan. 22, 1980 [DE] Fed. Rep. of Germany ....... 3002194

[51] Int. Cl.$^3$ .............................................. C23C 15/00
[52] U.S. Cl. ................................. 204/192 R; 204/298
[58] Field of Search ................. 204/192 R, 192 C, 298

[56] References Cited

U.S. PATENT DOCUMENTS 4,126,530 11/1978 Thornton ...................... 204/192 EL

FOREIGN PATENT DOCUMENTS 736512 9/1955 United Kingdom ................ 204/298

Primary Examiner—Aaron Weisstuch
Attorney, Agent, or Firm—Daley & Brandt

[57] ABSTRACT

An apparatus for coating substrates by cathode sputtering, containing a cathode and anode in a chamber, gas admixture and gas discharge means and a system for producing a vacuum in said chamber, at least one substrate being insulatingly installed in the cathode so that the part of the substrate to be coated extends beyond the cathode surface into the region of the plasma of the glow discharge. The method of coating is performed advantageously by means of a glow discharge in the anomalous cathode fall in a pressure range of from about 0.1–5 Torr at about 300 to 1000 V.

6 Claims, 2 Drawing Figures

METHOD AND APPARATUS FOR THE PARTIAL COATING OF A SUBSTRATE BY CATHODE SPUTTERING

The invention relates to an apparatus for the (partial) coating of a substrate or a plurality of substrates by cathode sputtering with a cathode, anode in a vacuum chamber having, gas admixture and discharge means and a vacuum producing system. The invention further relates to a method of coating one or a plurality of substrate(s) and the use of the apparatus and method.

The process of cathode sputtering in a vacuum permits the application of metals and metal derivatives with a high melting point onto substrates of the most different nature in a simple manner with excellent adhesive strength. With the aid of reactive cathode sputtering, oxides, nitrides and carbides of various metals can be deposited.

If a glow discharge is performed in the anomalous cathode fall, various processes take place in the electric discharge. The gas atmosphere between the electrodes is ionized by the voltage applied. The ions occurring, which almost solely represent cations, move under the influence of the electrical field against the cathode and impact there with great energy. The energy, becoming free on account of the impact of the ions against the surface, results on the one hand in an emission of electrons which contribute to the maintenance of the gas discharge, and on the other hand, an emission of uncharged metal atoms or molecules. As a result of the sputtering effect of the cathode surface by impacting ions, the discharge area in front of the cathode consists of a mixture of carrier gas, optional reactive gas, and metal atoms of the cathode. Due to the uncharged nature of the metal vapor, it is not subjected to the electrical field pattern and can therefore be caused to condensate on metallic or non-metallic substrates.

It is true that this type of metal transfer in vacuum has already been utilized industrially for a long period of time in the scope of various cathode sputtering processes, e.g., for producing mirrors, but this technique has not yet been able to succeed over the chemical precipitation technique (so-called CVD technique). Amongst other reasons, this is due to the fact that during a sputtering process, only a small percentage of the sputtered metal atoms released from the cathode reach the substrate to be coated. The majority of the sputtered metal atoms return to the metal surface due to impact with gas atoms. This return fraction is therefore also dependent on pressure. Other difficulties result from intensive heating of the cathode and low sputtering yields partly caused by the geometry of the sputtering apparatuses.

In conventional cathode sputtering systems, the substrates frequently lie directly on the anode, such as described e.g., in *Electronic Packaging and Production*, December 1978, pages 461 to 463. The substrates are thus completely subjected to the secondary electron bombardment, whereby very high substrate temperatures occur in the region up to about 500° C., according to sputtering rate, sputtering time, pressure of the carrier and reactive gases, etc. An improvement was achieved by a magnetic field support, via which the plasma is concentrated by means of a magnetic field directly before the cathode.

In other known devices, such as described for example in *Schweizer Maschinenmarkt*, no. 8/1972, pages 73–74, the substrates are located on work-piece holders in the vicinity of the cathode or the substrates are disposed on a rotating work-piece holder in the center of a cathode constructed in a hollow-cylindrical form, which can be subdivided into sectors.

The conventional apparatuses have not yet been able to offer entire satisfaction from the aspect of the yields obtainable, simplicity of operation, etc. The invention is therefore based on the object of providing an improved apparatus for coating one, or preferably a plurality of substrates by cathode sputtering in the anomalous cathode fall, wherein high sputtering yields can be achieved with simultaneously low reaction times. In particular, the apparatus should also permit the partial coating of substrates. On the other hand, with the apparatus the deposit of highly pure precipitates should be achievable, even in the case of reactive cathode sputtering. According to one aspect of this object, the invention is also directed to a method of coating using the apparatus. In particularly, using the apparatus and method of the invention, an especially favorable partial coating of measuring probes should be possible, e.g. measuring probes which are applied as measuring devices for the control of gas mixtures in internal combustion engines, with suitable coating materials, e.g. of precious metals.

This object is solved by providing an apparatus of the afore-mentioned type, which is characterized in that the substrate or substrates is (are) built into the cathode insulator in such a manner that the part of the substrate to be coated extends beyond the cathode surface into the region of the plasma of the glow discharge.

By installing the substrate in the cathode itself, a series of advantages are achieved. On account of the vicinity of the cathode surface to the substrate, the apparatus can be operated in a relatively high pressure range and therefore with higher performance and more favorable yields. Moreover, the return fraction of the sputtered metal atoms is utilized to an optimal extent. By the partial installation of the substrate(s) in the cathode surface, it can be ensured that only the portion of the substrate projecting beyond the surface is coated. The apparatus according to the invention is therefore especially suitable for the partial coating of substrates by means of cathode sputtering by glow discharge in the anomalous cathode fall. As the substrates become conductors themselves in the course of the sputtering process, even when they represent insulators themselves, such as e.g., substrates of ceramic, glass, etc., due to the sputtered metal coating, it is important to insulate the substrates from the cathode. In this respect, protective gaps are provided in the apparatus according to the invention, which can be varied in their form, depending on the means for holding the substrate or on the substrate itself. Thus, the protective gaps can be annular or funnel-shaped, reveal discontinuities, and e.g., a separating line can also be provided in front of the gap.

If with the apparatus according to the invention a plurality of substrates should be coated simultaneously, it is preferred that the cathode surrounds the anode symmetrically. For example, the anode can be surrounded in a rotation-symmetrical manner by the cathode, in which the holding means can be located in a uniform distribution. Thus, according to a preferred embodiment of the apparatus according to the invention, the cathode has a cylindrical shape or the form of a polygon, which can optionally be subdivided into segments. In the interior of such a hollow arrangement, expediently in the center thereof, the anode can be disposed and e.g., can be of rod-shaped construction. With such a construction, all the holding devices or recesses for receiving the substrate in the cathode are aligned in the direction of the anode in such a manner that for all the substrates an equal anode distance, and therefore a uniform coating situation results.

If the cathode is constructed, for example, as a hollow cylinder with a smooth or multiangular inner surface, the outer face of the cathode can be cooled in a simple manner, low substrate temperatures thus being obtainable. In particular, a water cooling device can be provided on the outer face of the cathode, for example a cooling jacket, etc.

In the method according to the invention, a plurality of substrates can be coated homogeneously in a short time by cathode sputtering, with the aid of the glow discharge in the anomalous cathode fall. In this respect, the process is conducted especially in a pressure range of about 0.1–5 Torr at e.g., voltages in the range of about 300 to 1000 V. The method according to the invention can be performed at a relatively low underpressure, e.g. in the range of about 1 to 1.5 Torr, on account of the specific configuration of the device. The apparatus and method of the invention are especially used in the simultaneous coating of a plurality of substrates where value is placed on a homogeneous and uniform coating. It can especially be applied for the coating of measuring probes, e.g., of ceramic probes for measuring the composition of exhaust gas, for the motor industry. Such probes are known and are presently being intensively tested. Such probes require relatively small ceramic bodies which can be constructed in the form of a tapering "hat". On their front, upper portions, the ceramic bodies are porous and therefore need to be coated in part in precisely this region. As a rule, a conductor strip extending to the lower bottom surface is located in the inner cavity of the probe. By the use of the apparatus or the method according to the invention, such ceramic probes can be coated very favorably with precious metals such as platinum, iridium, palladium, etc. However, not only coating with metals, of which platinium is presently preferred, is possible, but also derivatives of these or other metals can be caused to precipitate by the simultaneous presence of reactive gases, e.g., carbides, nitrides and oxides. It has been observed that by installing the probes in a preferred embodiment of the apparatus according to the invention, which is represented schematically in the following, a very favorable, highly pure and also homogeneous coating of the probe in its upper region can be achieved, as is desired. Such probes for the measurement of the composition of the exhaust gas of internal combustion engines are coated according to present methods by CVD coating in vacuum, proceeding from platinum acetonyl acetonate, or by the physical vapor deposition of platinium from a platinum melt. These methods of coating provide insufficient yields, whereas in the physical platinum vapor deposition a considerable expenditure of energy is still necessary. As compared thereto, with the method according to the invention, high coating yields are obtained with short coating times and reasonable expenditure of energy.

Preferred embodiments of the apparatus according to the invention are schematically represented in the enclosed figures. Even though these apparatuses have presently shown especially favorably coating results, these representations should not be understood to limit the scope of the invention.

Figure 1:
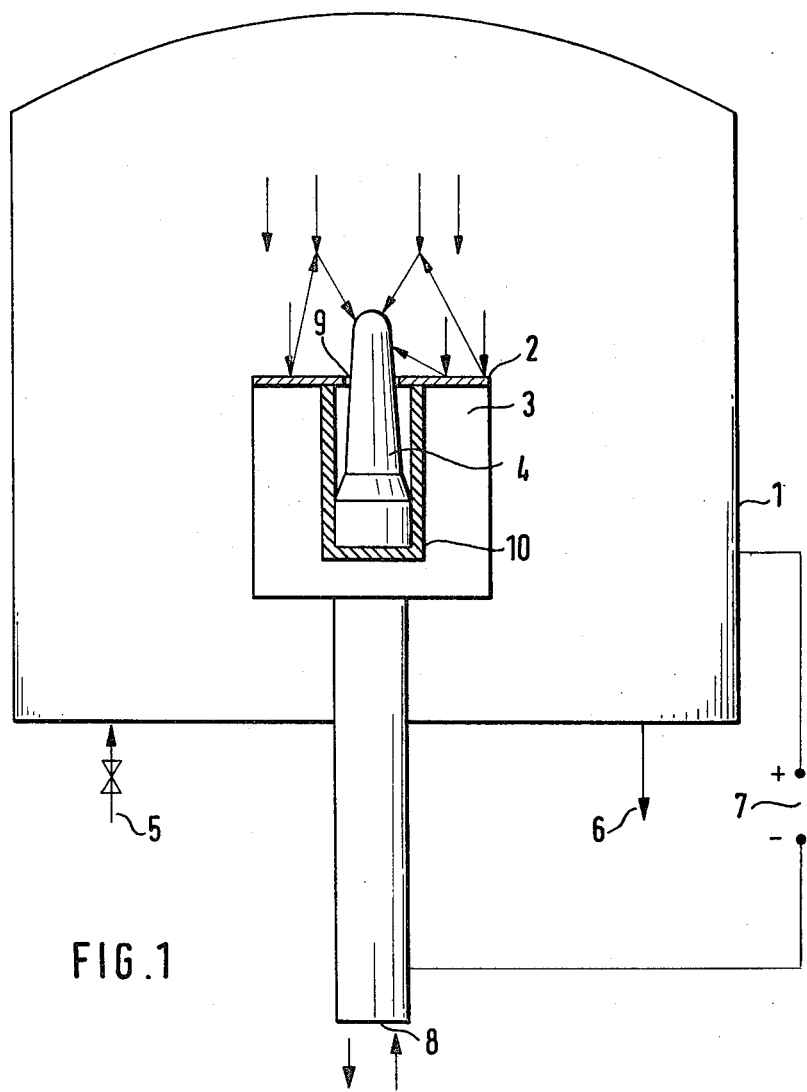
FIG. 1 shows the insulatingly positioning of a substrate, here a probe, in the cathode.

In FIG. 1, 1 represents the anode (and vacuum chamber), to which the cathode 3 with its surface 2 acting as target is arranged. In the cathode, the probe constituting the substrate is positioned in an insulating manner by a ceramic insulator 10 and an annular gap 9. In the glow discharge space, carrier gas is introduced, as a rule argon, via the gas inlet 5, and optionally withdrawn via the pump 6—in accordance with the desired pressure conditions. The arrows in the lower portion of the schematic drawing indicate means for water cooling 8 of the cathode portion, or optionally of the substrate portion positioned herein. It is evident from the schematic drawing that merely the upper tip of the measuring probe can be coated by cathode sputtering.

In this schematically shown apparatus, a partial coating of the tip of the probe with platinum can take place, for example, if the cathode target surface is formed of platinum. If coatings with other metals or metal derivatives, e.g., platinum metal oxide, are desired, in addition reactible gases such as oxygen, nitrogen or C-delivering components can be introduced.

Figure 2:
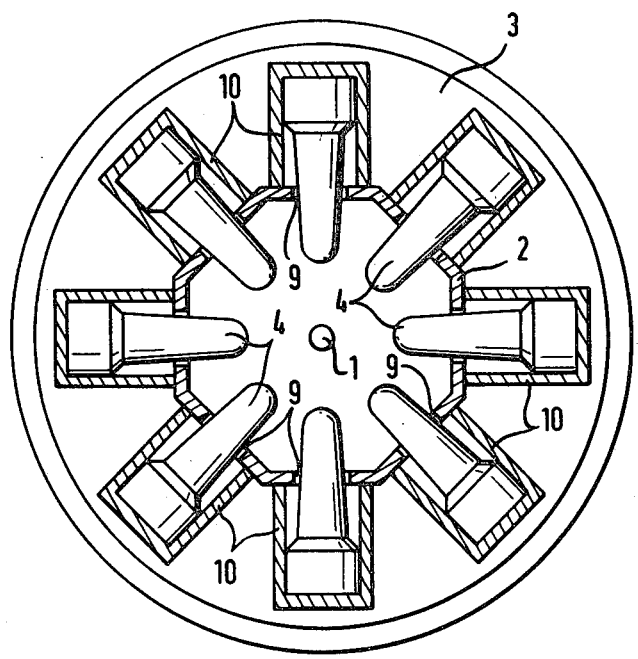
FIG. 2 shows an arrangement of a plurality of probes inside a cathode constructed as a polygon.

In FIG. 2, the arrangement of a plurality of probes 4 inside a cathode 3 constructed as a polygon is shown, the surface 2 of which acts as target, e.g., platinum. Inside the cavity of the cathode, there is a rod-like anode 1, around which the probes are symmetrically arranged with equal spacing. Holding means for the substrate, with which these can optionally also be set into rotation are omitted from the schematic drawing, together with rotational means for the cathode as a whole and also the auxiliary means such as gas supply and discharge means, vacuum chamber, etc. In this illustrated embodiment of the apparatus according to the invention, the rod-like anode is constructed in a manner known per se insulated from the cathode, formed as a hollow cylinder, on the upper and lower portion thereof.

The course of procedure in the method according to the invention should be further explained with reference to FIGS. 1 and 2. As can be seen from FIG. 1, the probe's tip to be coated protrudes above the cathode surface in such a manner that only the part of the probe to be sputtered is subjected to the plasma of the glow discharge. The sputtered metal layer is electrically insulated from the cathode but is surrounded by negative glow. If a suitable pressure range is now chosen, the sputtered metal layer can withdraw negative charge carriers from the glow and even burn as a cathode itself, with less capacity. This means that the sputtered atoms are again sputtered with less binding energy, whereby a more uniform, faultless layer results. Furthermore, in this arrangement of the probe, the return fraction of the sputtered metal atoms is better utilized. On account of the close vicinity of the cathode to the substrate, it can be operated at a relatively high pressure range, e.g. in the range of 1 to 2 Torr. Accordingly, the performance and thus the yield can be increased.

FIG. 2 shows that the apparatus provides a complete system for the coating of a plurality of exhaust gas probes with platinum for example, with the probes arranged longitudinally in the form of a polygon. The advantage of this arrangement is that the largest portion of sputtered metal atoms from the cathode surface, which do not condense on a substrate, participate again in the sputtering process. This happens because the metal atoms which do not condense on a substrate condense on the bordering surfaces, which in turn represent a cathode. If high current densities are desired with this arrangement, also the so-called "hollow discharge effect" can be used with these given geometrical conditions.

The apparatus according to the invention is suitable for the coating of a plurality of substrates, whereby the coating of measuring sensors or measuring probes, e.g., of porous ceramic has been given as the presently preferred use. However, the invention can be applied in the same manner for the coating of other substrates, e.g., razor blades, small mirrors, etc.

The apparatus according to the invention can be applied advantageously for the coating of substrates, whereby the coating can be performed independent of whether the substrates are electrically conductive or non-conductive. The above further shows that it is not necessary for the operation of the apparatus according to the invention to control the coating process by magnetic fields. It also is not necessary to apply high-frequency magnetic fields. On the contrary, the apparatus or method, respectively, according to the invention for coating substrates is performed with direct current.

We claim:

1. In apparatus for the partial coating of at least one substrate by cathode sputtering, comprising a cathode having a cavity therein and a sputtering surface, an anode, a chamber forming an enclosure around at least one of said cathode and anode, gas admixture and gas discharge means, and a system for producing a vacuum in said chamber, characterized in that said cavity in said cathode includes means for insulatingly mounting said at least one substrate in such manner that the parts of said at least one substrate which are not to be coated are disposed within said cavity and the parts to be coated extend beyond said sputtering surface.

2. An apparatus according to claim 1, characterized in that the cathode surrounds the anode symmetrically.

3. An apparatus according to claim 2, characterized in that holding means comprising recesses for receiving the at least one substrate in the cathode are provided so that an equal spacing to the anode is provided for all the substrates.

4. An apparatus according to claim 1, 2 or 3, characterized in that the cathode is provided with a cooling device on its rear face.

5. An apparatus according to claim 2, characterized in that the sputtering surface comprises a cylindrical or polygonal inner face of said cathode surrounding the anode.

6. A method for coating a plurality of substrates by cathode sputtering, comprising providing cathode means having a plurality of cavities therein and a sputtering surface, providing an anode, forming a chamber enclosing at least one of said cathode and anode, supplying a carrier gas to and withdrawing said carrier gas from said chamber, maintaining a condition of vacuum within said chamber, characterized by insulatingly mounting said substrates in said cavities in such manner that the parts thereof which are not to be coated are disposed within their respective cavities and the parts to be coated extend beyond the cathode means sputtering surface, and in that by means of a glow discharge in the anomalous cathode fall in a pressure range of about 0.1–5 Torr, the coating is performed at about 300 to 1000 V.

* * * * *